United States Patent
Tokura et al.

(10) Patent No.: US 7,218,441 B2
(45) Date of Patent: May 15, 2007

(54) NON-POLARIZATION LIGHT SOURCE DEVICE AND RAMAN AMPLIFIER

(75) Inventors: Toshiyuki Tokura, Tokyo (JP); Taichi Kogure, Tokyo (JP); Takashi Sugihara, Tokyo (JP); Kuniaki Motoshima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 214 days.

(21) Appl. No.: 10/482,223

(22) PCT Filed: Jan. 27, 2003

(86) PCT No.: PCT/JP03/00729

§ 371 (c)(1),
(2), (4) Date: Dec. 30, 2003

(87) PCT Pub. No.: WO03/065522

PCT Pub. Date: Aug. 7, 2003

(65) Prior Publication Data

US 2004/0165254 A1    Aug. 26, 2004

(30) Foreign Application Priority Data

Jan. 30, 2002    (JP)    ............................. 2002-022453

(51) Int. Cl.
*H01S 3/091*    (2006.01)
*H01S 3/108*    (2006.01)
*G20B 6/27*    (2006.01)

(52) U.S. Cl. ........................................ 359/334; 385/11
(58) Field of Classification Search ............... 359/334; 385/11
See application file for complete search history.

(56) References Cited

U.S. PATENT DOCUMENTS 3,728,643 A * 4/1973 Chu ......................... 333/21 A (Continued)

FOREIGN PATENT DOCUMENTS

EP    0574749 A2    12/1993

(Continued)

OTHER PUBLICATIONS

American Meteorology Society Glossary. Degree of Polarization. Published online by Allen Press. Unknown upload date. Downloaded: Nov. 8, 2005. http://amsglossary.allenpress.com/glossary/search?id=degree-of-polarization2.*

(Continued)

*Primary Examiner*—Jack Keith
*Assistant Examiner*—Ari M. Diacou
(74) *Attorney, Agent, or Firm*—Birch, Stewart, Kolasch & Birch, LLP

(57) ABSTRACT

A laser light source outputs a virtually linearly-polarized light beam that has plural mode components arranged at an interval of an almost equal angular frequency. A polarization dispersion device is connected to the laser light source in such a way that a polarization axis of the polarization dispersion device is at 45° with respect to a polarization axis of the light beam output from the laser light source. This polarization dispersion device effects on the light beam output from the laser light source a polarization mode dispersion that is not in the vicinity of $(2\pi/\Delta\omega)$, where $\Delta\omega$ is a mode interval angular frequency.

12 Claims, 13 Drawing Sheets

U.S. PATENT DOCUMENTS

| | | | |
|---|---|---|---|
| 3,728,644 A * | 4/1973 | Chu | 333/21 A |
| 4,042,302 A | 8/1977 | Wentz | |
| 4,556,293 A * | 12/1985 | Burns et al. | 385/11 |
| 4,572,608 A * | 2/1986 | Mochizuki et al. | 385/11 |
| 5,457,756 A * | 10/1995 | Hartl et al. | 385/11 |
| 5,633,959 A * | 5/1997 | Niki et al. | 385/11 |
| 5,692,082 A | 11/1997 | Fukushima | |
| 5,881,185 A * | 3/1999 | Feth et al. | 385/11 |
| 6,522,796 B1 * | 2/2003 | Ziari et al. | 385/11 |
| 6,760,151 B1 * | 7/2004 | Vail et al. | 359/341.3 |
| 6,972,842 B2 * | 12/2005 | Doerr et al. | 356/364 |
| 6,977,769 B2 * | 12/2005 | Matsushita et al. | 359/334 |
| 2002/0025111 A1 | 2/2002 | Koshi | |
| 2002/0141698 A1 * | 10/2002 | Matsushita et al. | 385/31 |

FOREIGN PATENT DOCUMENTS

| | | |
|---|---|---|
| EP | 1164668 A2 | 12/2001 |
| JP | 8-254668 A | 10/1996 |
| JP | 09326758 | 12/1997 |
| JP | 2000-151507 A | 5/2001 |
| JP | 2001-147454 A | 5/2001 |
| JP | 2002-31735 | 1/2002 |
| JP | 2001-3356377 A | 4/2002 |
| JP | 2002-122896 A | 4/2002 |
| WO | WO 03/034557 A1 | 4/2003 |

OTHER PUBLICATIONS

Wikipedia: the free encyclopedia. Polarization. Updated: Nov. 1, 2005. Downloaded: Nov. 8, 2005. http://en.wikipedia.org/w/index.php?title=Polarization&oldid=27831340.*

Wikipedia: the free encyclopedia. Polarization. Updated: Nov. 3, 2003. Downloaded: Nov. 8, 2005. http://en.wikipedia.org/w/index.php?title=Polarization&oldid=2070484.*

Wikipedia: the free encyclopedia. Polarization. Updated: Dec. 17, 2002. Downloaded: Nov. 8, 2005. http://en.wikipedia.org/w/index.php?title=Polarization&oldid=554808.*

Propagation of partially polarized light in dichroic and birefringent media□□J F Mosiño et al (Apr. 2001) J. Opt. B: Quantum Semiclass. Opt. 3 S159-S165 doi:10.1088/1464-4266/3/2/362.*

Polarization of light: from Basics to Instruments (in less than 100 slides). Nadine Manset ww.cfht.hawaii.edu/~manset/PolarizationLightIntro.ppt.*

Hecht, Eugene. Optics, 4th Ed. Addison Wesley, San Fransisco, CA 2002. pp. 313-316.*

Silfvast, William T. Laser Fundamentals, 2nd Ed. Cambridge University Press, New York, NY, 2004. pp. 249-253, 371-380.*

Weik, Martin H. Fiber Optics Standard Dictionary, 3rd Ed. Chapman and Hall, New York, NY, 1997. p. 869.*

Depolarised broadband source. Moeller, R. P.; Burns, W. K. Electronics Letters (ISSN 0013-5194), vol. 19, Mar. 3, 1983, p. 187, 188. Abstract Only. Found on http://adsabs.harvard.edu/abs/1983EIL . . . 19 . . . 187M. Downloaded:Dec. 13, 2006.*

J F Mosino, A Starodumov, O Barbosa-Garcia and V N Filippov. Propagation of partially polarized light in dichroic and birefringent media. J. Opt. B: Quantum Semiclass. Opt. 3 (2001) S159-S165. Received Oct. 27, 2000, in final form Mar. 2, 2001.*

Xu Fuyun Zhang Mingqin Chen Wenlu Wang Lianyen Wei Ruyao. Study on single element monochromatic light depolarizer. 174-181 / SPIE vol. 2540.*

Petr Hlubina. Interference of white light analyzed at the output of a birefringent crystal by a fibre-optic spectrometer. Optics Communications 251 (2005) 367-375.*

Petr Hlubina , Dalibor Ciprian, Lenka Knyblova. Interference of white light in tandem configuration of birefringent crystal and sensing birefringent fiber. Optics Communications 260 (2006) 535-541.*

Konrad Bohm, Klaus Petermann, Edgar Weidel. Performance of Lyot Depolarizers with Birefringent Single-Mode Fibers. Jour. Lightwave Tech. vol. LT-1 No. 1, Mar. 1983, pp. 71-74.*

J. S. Wang, J. R. Costelloe, and R. H. Stolen. Reduction of the Degree of Polarization of a Laser Diode with a Fiber Lyot Depolarizer. IEEE Photonics Technology Letters, vol. 11, No. 11, Nov. 1999 pp. 1449-1451.*

N. Azami. E. Villenebe, A. Villeneuve, F. Gonthier. All-SOP All-Fiber Depolarizer Linear Design. vol. 1 / OFC 2003. pp. 230-231.*

Christian Brosseau. Fundimentals of Polarized Light: A Statistical Optics Approach. Wiley Publishing, New York, 1998. pp. 235-243, 275-277.*

Born and Wolf. Principles of Optics, 7th Ed. Cambridge University Press, New York, © 1999. pp. 619-632.*

Dennis Goldstein. Polarized Light, 2nd Ed. Marcel Dekker Inc. New York © 2003. pp. 65-67, 531-532.*

Kiyofumi Mochizuki. Degree of polarization in jointed fibers: the Lyot depolarizer. Applied Optics / vol. 23, No. 19 / Oct. 1, 1984. pp. 3284-3288.*

Sakai, J. Kimura, T. Birefringence and polarization characteristics of single-mode optical fibers under elastic deformations. Quantum Electronics, IEEE. Jun. 1981. vol. 17, Issue: 6. On pp. 1041-1051.*

Sakai, Machida, Kimura. Degree of Polarization in Anisotropic Single-Mode Optical Fibers: Theory. Microwave Theory and Techniques, IEEE Transactions on Apr. 1982. vol. 82, Issue: 4. On pp. 334-341.*

Flannery, et al. "Depolarisation Techniques for Distributed Raman Pump Units Using Semiconductor Bragg Grating Stabilised Laser Sources"; National Fiber Optic Engineers Conference, 2001 Technical Proceedings; pp. 1251-1259.

Tokura et al., Information and Communication Engineers Gijutsu Kenkyu Hokoku, vol. 101, No. 649, pp. 19-24 (2002).

* cited by examiner

NON-POLARIZATION LIGHT SOURCE DEVICE AND RAMAN AMPLIFIER

TECHNICAL FIELD

The present invention relates to a non-polarized light source that generates and outputs a non-polarizing light beam and also relates to a Raman amplifier that uses the non-polarized light source as a pump light source.

BACKGROUND ART

In an optical transmission system, which carries out Raman amplification, the loss caused in an optical transmission channel or in the optical parts on the optical transmission channel can be corrected by adjusting the Raman gain. The correction of the loss is advantageous, because, as compared to an optical amplification transmission system that employs only a lumped parameter style optical amplifier, it is possible to maintain the required signal-to-noise ratio during the transmission and thereby transmit the same signal to a longer distance.

However, the Raman gain is polarization-dependent. One approach, to solve this problem, is to use a non-polarized pump light. A linearly-polarized pump light may be non-polarized by polarization combining (see, for instance, "optical transmission system" disclosed in the Japanese Patent Laid-Open Publication No. 2000-151507) or by using a polarization dispersion device (see, for instance, "laser diode module and depolarizer" disclosed in the Japanese Patent Laid-Open Publication No. H8-254668).

In the polarization combining, it is necessary to provide two pump light sources that transmit light beams of an almost equal intensity. Moreover, to improve the wavelength characteristics of the Raman gain, it is desirable to use two or more pump lights that have different central wavelengths. In other words, in the polarization combining, two light sources are necessary for each pump wavelength. Thus, it is necessary to provide the pump light sources two times of the number of pump wavelength.

It is common in the polarization dispersion device to use a semiconductor laser module (LD) as an optical source. Such a semiconductor laser module generally includes a wavelength stabilizing fiber grating as a typical pump light source used in the Raman amplification of a light signal that has a wavelength in the range of 1.55 micrometers ($\mu$m) and forms an external resonator. Moreover, such a semiconductor laser module has a central wavelength of 1430 nanometers (nm), a full width at half maximum of an optical spectral envelope of 145 gigahertz (GHz), a vertical mode interval of the semiconductor laser module device of 33 GHz, and a full width at half maximum of the vertical mode of the semiconductor laser module device of 10 GHz.

When the polarization dispersion device is used, lesser pump light sources are required as compared to those required in the polarization combining. However, in case of the polarization dispersion, even if an optical path difference, which is longer than a coherent length (about 1 millimeter (mm)) corresponding to the full width at half maximum of the optical spectral envelope, is assigned between two polarization modes, the possibility of coherency still remains. As a result, sometimes polarization of the pump light cannot be eliminated so that it becomes necessary to assign an optical path difference longer than the coherent length (about 2 centimeters (cm)) corresponding to the vertical mode of the LD device.

Assuming that a polarization maintaining fiber having polarization dispersion of about 1.4 picoseconds (ps) in 1 meter (m) is used, the optical path difference between the two polarization modes is about 0.3 mm. Therefore, the polarization maintaining fiber has to be 70 m or longer. This poses a problem in terms of cost and the implementation capacity.

It is an object of the present invention to solve at least the problems in the conventional technology.

DISCLOSURE OF THE INVENTION

A non-polarized light source according to one aspect of the present invention includes a laser light source that transmits a virtually linearly-polarized light beam, the virtually linearly-polarized light beam having plural mode components arranged at an interval of almost equal angular frequency; and a polarization dispersion device that is connected to the laser light source in such a way that a polarization axis of the polarization dispersion device is at 45° with respect to a polarization axis of the light beam output from the laser light source, wherein the polarization dispersion device effects on the light beam output from the laser light source a polarization mode dispersion that is not in the vicinity of ($2\pi/\Delta\omega$), where $\Delta\omega$ is a mode interval angular frequency.

A non-polarized light source according to another aspect of the present invention includes a laser light source that transmits a virtually linearly-polarized light beam, the virtually linearly-polarized light beam having plural mode components arranged at an interval of almost equal angular frequency; and a polarization maintaining fiber that is connected to the laser light source in such a way that a polarization axis of the polarization maintaining fiber is at 45° with respect to a polarization axis of the light beam output from the laser light source, wherein the polarization maintaining fiber effects on the light beam output from the laser light source a polarization mode dispersion that is not in the vicinity of ($2\pi/\Delta\omega$), where $\Delta\omega$ is a mode interval angular frequency.

A non-polarized light source according to still another aspect of the present invention includes a laser light source that transmits a virtually linearly-polarized light beam, the virtually linearly-polarized light beam having plural mode components arranged at an interval of almost equal angular frequency; and a polarization dispersion device that is connected to the laser light source in such a way that a polarization axis of the polarization dispersion device is at 45° with respect to a polarization axis of the light beam output from the laser light source, wherein the polarization dispersion device effects on the light beam output from the laser light source a polarization mode dispersion $\tau$ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function $A(\omega')$ of spectral form of a relative angular frequency $\omega' = \omega - \omega_c$ of the angular frequency $\omega$ that has a mode interval angular frequency $\Delta\omega$ and a central angular frequency $\omega_c$ as criteria.

A non-polarized light source according to still another aspect of the present invention includes a laser light source that transmits a virtually linearly-polarized light beam, the virtually linearly-polarized light beam having plural mode components arranged at an interval of almost equal angular frequency; and a polarization maintaining fiber that is connected to the laser light source in such a way that a polarization axis of the polarization maintaining fiber is at 45° with respect to a polarization axis of the light beam output from the laser light source (1), wherein the polarization maintaining fiber effects on the light beam output from the laser light source a polarization mode dispersion τ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function A(ω') of spectral form of a relative angular frequency ω'=ω−ωc of the angular frequency ω that has a mode interval angular frequency Δω and a central angular frequency ωc as criteria.

A non-polarized light source according to still another aspect of the present invention includes a first laser light source that outputs a virtually linearly-polarized first light beam and a second laser light source that outputs a virtually linearly-polarized second light beam, the first light beam and the second light beam having plural mode components arranged at an interval of an almost equal angular frequency; a polarization combining unit that polarization-combines the first light beam and the second light beam; and a polarization dispersion device that is connected to the polarization combining unit in such a way that a polarization axis of the polarization dispersion device is at 45° with respect to a polarization axis of the light beam output from the polarization combining unit, wherein the polarization dispersion device effects on the light beam output from the laser light source a polarization mode dispersion τ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function A(ω') of spectral form of a relative angular frequency ω'=ω−ωc of the angular frequency ω that has a mode interval angular frequency Δω and a central angular frequency ωc as criteria.

A non-polarized light source according to still another aspect of the present invention includes a first laser light source that outputs a virtually linearly-polarized first light beam and a second laser light source that outputs a virtually linearly-polarized second light beam, the first light beam and the second light beam having plural mode components arranged at an interval of an almost equal angular frequency; a polarization combining unit that polarization-combines the first light beam and the second light beam; and a polarization maintaining fiber that is connected to the polarization combining unit in such a way that a polarization axis of the polarization maintaining fiber is at 45° with respect to a polarization axis of the light beam output from the polarization combining unit, wherein the polarization maintaining fiber effects on the light beam output from the laser light source a polarization mode dispersion τ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function A(ω') of spectral form of a relative angular frequency ω'=ω−ωc of the angular frequency ω that has a mode interval angular frequency Δω and a central angular frequency ωc as criteria.

A Raman amplifier according to still another aspect of the present invention includes an optical fiber that is a Raman-amplifying medium and that carries a light signal; a non-polarized light source that generates a pump light in a wavelength band that effects a Raman gain on the light signal, the non-polarized light source includes a laser light source that transmits a virtually linearly-polarized light beam, the virtually linearly-polarized light beam having plural mode components arranged at an interval of almost equal angular frequency; and a polarization dispersion device that is connected to the laser light source in such a way that a polarization axis of the polarization dispersion device is at 45° with respect to a polarization axis of the light beam output from the laser light source, wherein the polarization dispersion device effects on the light beam output from the laser light source a polarization mode dispersion that is not in the vicinity of (2π/Δω), where Δω is a mode interval angular frequency; and an injection unit that injects into the optical fiber the pump light.

A Raman amplifier according to still another aspect of the present invention includes an optical fiber that is a Raman-amplifying medium and that carries a light signal; a non-polarized light source that generates a pump light in a wavelength band that effects a Raman gain on the light signal, the non-polarized light source includes a laser light source that transmits a virtually linearly-polarized light beam, the virtually linearly-polarized light beam having plural mode components arranged at an interval of almost equal angular frequency; and a polarization maintaining fiber that is connected to the laser light source in such a way that a polarization axis of the polarization maintaining fiber is at 45° with respect to a polarization axis of the light beam output from the laser light source, wherein the polarization maintaining fiber effects on the light beam output from the laser light source a polarization mode dispersion that is not in the vicinity of (2π/Δω), where Δω is a mode interval angular frequency; and an injection unit that injects into the optical fiber the pump light.

A Raman amplifier according to still another aspect of the present invention includes an optical fiber that is a Raman-amplifying medium and that carries a light signal; a non-polarized light source that generates a pump light in a wavelength band that effects a Raman gain on the light signal, the non-polarized light source includes a first laser light source that outputs a virtually linearly-polarized first light beam and a second laser light source that outputs a virtually linearly-polarized second light beam, the first light beam and the second light beam having plural mode components arranged at an interval of an almost equal angular frequency; a polarization combining unit that polarization-combines the first light beam and the second light beam; and a polarization dispersion device that is connected to the polarization combining unit in such a way that a polarization axis of the polarization dispersion device is at 45° with respect to a polarization axis of the light beam output from the polarization combining unit, wherein the polarization dispersion device effects on the light beam output from the laser light source a polarization mode dispersion τ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function $A(\omega')$ of spectral form of a relative angular frequency $\omega'=\omega-\omega c$ of the angular frequency $\omega$ that has a mode interval angular frequency $\Delta\omega$ and a central angular frequency $\omega c$ as criteria; and an injection unit that injects into the optical fiber the pump light.

A Raman amplifier according to still another aspect of the present invention includes a first optical fiber and a second optical fiber that are a Raman-amplifying media and carry a first light signal and a second light signal; a first non-polarized light source that outputs a first light beam and a second non-polarized light source that outputs a second light beam, each of the first non-polarized light source and the second non-polarized light source including a laser light source that transmits a virtually linearly-polarized light beam, the virtually linearly-polarized light beam having plural mode components arranged at an interval of almost equal angular frequency; and a polarization dispersion device that is connected to the laser light source in such a way that a polarization axis of the polarization dispersion device is at 45° with respect to a polarization axis of the light beam output from the laser light source, wherein the polarization dispersion device effects on the light beam output from the laser light source a polarization mode dispersion that is not in the vicinity of $(2\pi/\Delta\omega)$, where $\Delta\omega$ is a mode interval angular frequency; a combining and separating unit that combines the first light beam and the second light beam and splits the combined light beam into a first split-light beam and a second split-light beam; and a first injection unit that injects into the first optical fiber the first split-light beam; and a second injection unit that injects into the second optical fiber the second split-light beam.

A Raman amplifier according to still another aspect of the present invention includes a first optical fiber and a second optical fiber that are a Raman-amplifying media and carry a first light signal and a second light signal; a first non-polarized light source that outputs a first light beam and a second non-polarized light source that outputs a second light beam, each of the first non-polarized light source and the second non-polarized light source including a laser light source that transmits a virtually linearly-polarized light beam, the virtually linearly-polarized light beam having plural mode components arranged at an interval of almost equal angular frequency; and a polarization dispersion device that is connected to the laser light source in such a way that a polarization axis of the polarization dispersion device is at 45° with respect to a polarization axis of the light beam output from the laser light source, wherein the polarization dispersion device effects on the light beam output from the laser light source a polarization mode dispersion τ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function $A(\omega')$ of spectral form of a relative angular frequency $\omega'=\omega-\omega c$ of the angular frequency $\omega c$ that has a mode interval angular frequency $\Delta\omega$ and a central angular frequency $\omega c$ as criteria; a combining and separating unit that combines the first light beam and the second light beam and splits the combined light beam into a first split-light beam and a second split-light beam; and a first injection unit that injects into the first optical fiber the first split-light beam; and a second injection unit that injects into the second optical fiber the second split-light beam.

A Raman amplifier according to still another aspect of the present invention includes a first optical fiber and a second optical fiber that are a Raman-amplifying media and carry a first light signal and a second light signal; a first non-polarized light source that outputs a first light beam and a second non-polarized light source that outputs a second light beam, each of the first non-polarized light source and the second non-polarized light source including a first laser light source that outputs a virtually linearly-polarized first light beam and a second laser light source that outputs a virtually linearly-polarized second light beam, the first light beam and the second light beam having plural mode components arranged at an interval of an almost equal angular frequency; a polarization combining unit that polarization-combines the first light beam and the second light beam; and a polarization dispersion device that is connected to the polarization combining unit in such a way that a polarization axis of the polarization dispersion device is at 45° with respect to a polarization axis of the light beam output from the polarization combining unit, wherein the polarization dispersion device effects on the light beam output from the laser light source a polarization mode dispersion τ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function $A(\omega')$ of spectral form of a relative angular frequency $\omega'=\omega-\omega c$ of the angular frequency $\omega$ that has a mode interval angular frequency $\Delta\omega$ and a central angular frequency $\omega c$ as criteria; a combining and separating unit that combines the first light beam and the second light beam and splits the combined light beam into a first split-light beam and a second split-light beam; and a first injection unit that injects into the first optical fiber the first split-light beam; and a second injection unit that injects into the second optical fiber the second split-light beam.

A Raman amplifier according to still another aspect of the present invention includes an optical fiber that is a Raman-amplifying medium and that carries a light signal; a plurality of non-polarized light sources each of which generates a pump light having varying central wavelengths in a wavelength band that effects a Raman gain on a light signal, each of the non-polarized light sources including a laser light source that transmits a virtually linearly-polarized light beam, the virtually linearly-polarized light beam having plural mode components arranged at an interval of almost equal angular frequency; and a polarization dispersion device that is connected to the laser light source in such a way that a polarization axis of the polarization dispersion device is at 45° with respect to a polarization axis of the light beam output from the laser light source, wherein the polarization dispersion device effects on the light beam output from the laser light source a polarization mode dispersion that is not in the vicinity of $(2\pi/\Delta\omega)$, where $\Delta\omega$ is a mode interval angular frequency; and a wavelength-combining and injection unit that wavelength-combines the pump beams output from the non-polarized light sources and injects the pump lights into the optical fiber.

A Raman amplifier according to still another aspect of the present invention includes an optical fiber that is a Raman-amplifying medium and that carries a light signal; a plurality of non-polarized light sources each of which generates a pump light having varying central wavelengths in a wavelength band that effects a Raman gain on a light signal, each of the non-polarized light sources including a laser light source that transmits a virtually linearly-polarized light beam, the virtually linearly-polarized light beam having plural mode components arranged at an interval of almost equal angular frequency; and a polarization dispersion device that is connected to the laser light source in such a way that a polarization axis of the polarization dispersion device is at 45° with respect to a polarization axis of the light beam output from the laser light source, wherein the polarization dispersion device effects on the light beam output from the laser light source a polarization mode dispersion $\tau$ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function $A(\omega')$ of spectral form of a relative angular frequency $\omega'=\omega-\omega c$ of the angular frequency $\omega$ that has a mode interval angular frequency $\Delta\omega$ and a central angular frequency $\omega c$ as criteria; and a wavelength-combining and injection unit that wavelength-combines the pump beams output from the non-polarized light sources and injects the pump lights into the optical fiber.

A Raman amplifier according to still another aspect of the present invention includes an optical fiber that is a Raman-amplifying medium and that carries a light signal; a plurality of non-polarized light sources each of which generates a pump light having varying central wavelengths in a wavelength band that effects a Raman gain on a light signal, each of the non-polarized light sources including a first laser light source that outputs a virtually linearly-polarized first light beam and a second laser light source that outputs a virtually linearly-polarized second light beam, the first light beam and the second light beam having plural mode components arranged at an interval of an almost equal angular frequency; a polarization combining unit that polarization-combines the first light beam and the second light beam; and a polarization dispersion device that is connected to the polarization combining unit in such a way that a polarization axis of the polarization dispersion device is at 45° with respect to a polarization axis of the light beam output from the polarization combining unit, wherein the polarization dispersion device effects on the light beam output from the laser light source a polarization mode dispersion $\tau$ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function $A(\omega')$ of spectral form of a relative angular frequency $\omega'=\omega-\omega c$ of the angular frequency $\omega$ that has a mode interval angular frequency $\Delta\omega$ and a central angular frequency $\omega c$ as criteria; and a wavelength-combining and injection unit that wavelength-combines the pump beams output from the non-polarized light sources and injects the pump lights into the optical fiber.

These and other objects, features and advantages of the present invention are specifically set forth in or will become apparent from the following detailed descriptions of the invention when read in conjunction with the accompanying drawings.

BEST MODE FOR CARRYING OUT THE INVENTION

Exemplary embodiments of the non-polarized light source and the Raman amplifier according to the present invention are explained next with reference to the accompanying drawings.

Figure 1:
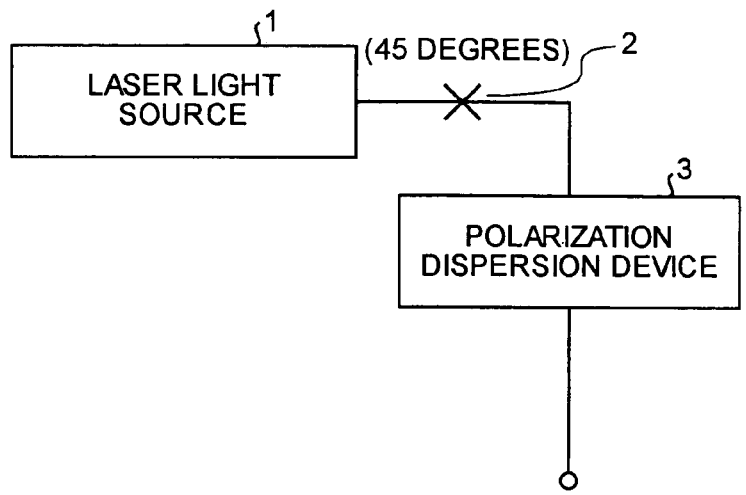
FIG. 1 is a schematic diagram of a non-polarized light source according to a first embodiment of the present invention.

FIG. 1 is a schematic diagram of a non-polarized light source according to a first embodiment of the present invention. This non-polarized light source includes a laser beam 1, which transmits a virtually linearly-polarized light beam, and a polarization dispersion device 3, on which the light beam is incident via a 45-degrees node 2. The polarization dispersion device 3 outputs a non-polarized light.

Figure 2:
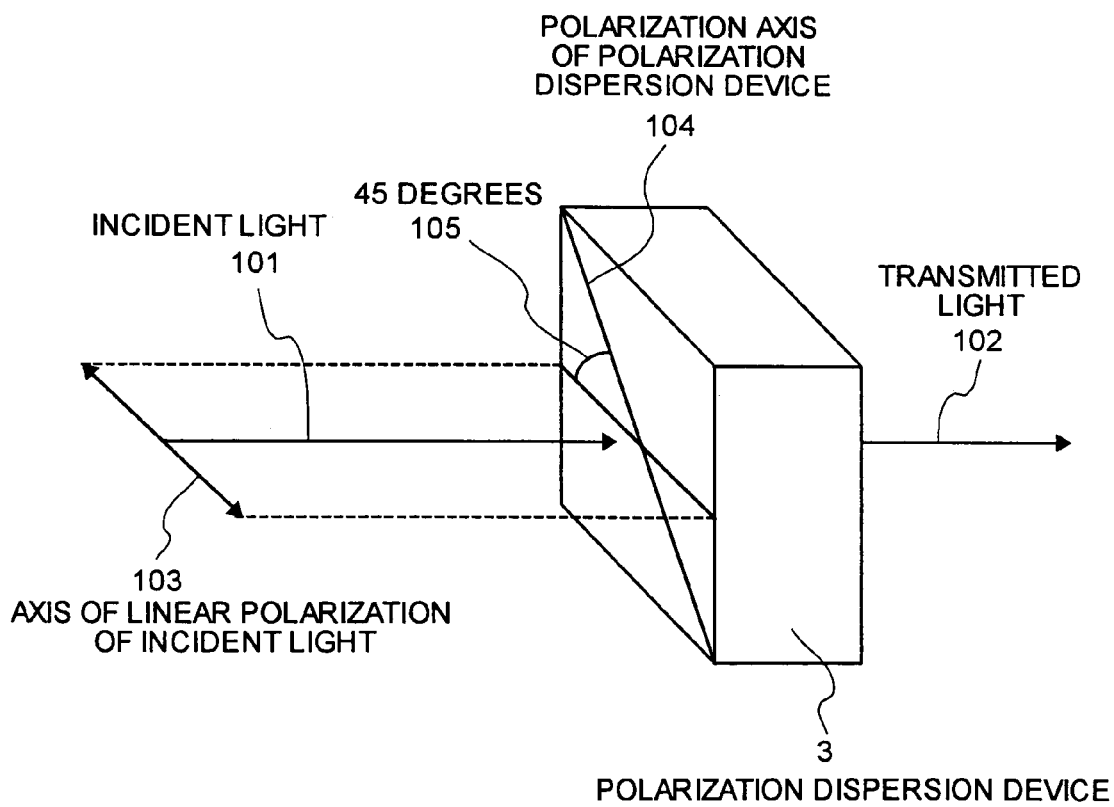
FIG. 2 illustrates the relation between a laser beam at the 45° node shown in FIG. 1 and the polarization axis of a polarization dispersion device.

FIG. 2 is a schematic that explains how the node 2 polarizes the light. The node 2 rotates an axis 103 of a linearly polarized incident light 101 such that the axis 103 matches with a polarization axis 104 of the polarization dispersion device 3.

Figure 3:
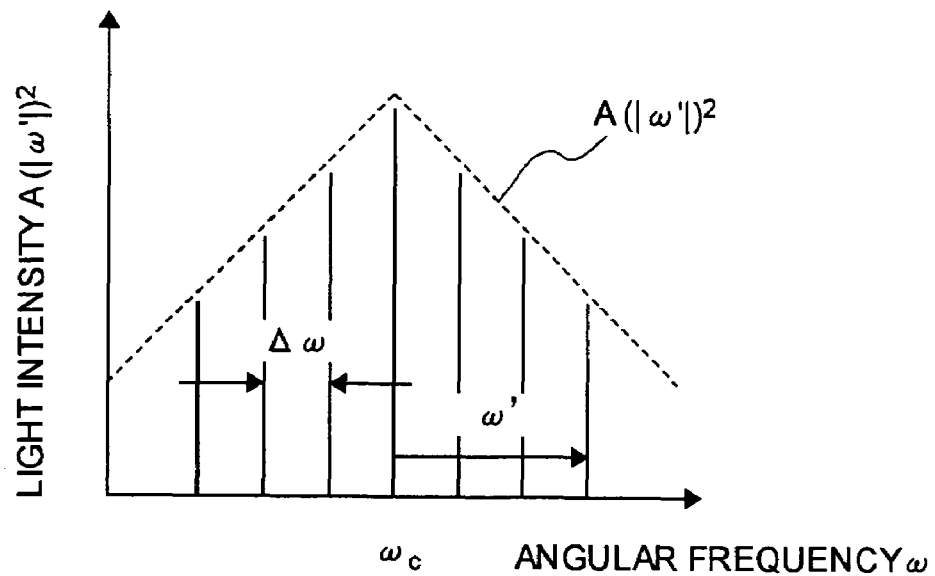
FIG. 3 is a spectrum of a light beam output from the laser light source shown in FIG. 1.

FIG. 3 is a spectrum of the light beam output from the laser beam 1. The horizontal axis represents an angular frequency ω and the vertical axis represents a light intensity $A(|\omega'|)^2$. The spectrum is almost symmetric with respect to a central angular frequency $\omega_c$. Moreover, plural mode-components are distributed at an interval Δω on either side of the central angular frequency $\omega_c$. The electrical field intensity distribution of these mode components is determined by a function $A(|\omega'|)$ of the spectral form, the vertical axis is determined by the function $A(|\omega'|)^2$ that is equivalent to the light intensity, where ω' is a relative angular frequency (ω'=ω−$\omega_c$) with the central angular frequency $\omega_c$ as the reference. The function $A(\omega'=0)=1$ with respect to the central angular frequency $\omega_c$.

This spectrum is typical of a Fabry-Perot-type semiconductor laser device, which is generally used as the pump light source. The interval Δω is equivalent to a vertical mode interval of a semiconductor laser device. In other words, the laser light source 1 may be the Fabry-Perot-type semiconductor laser device.

Figure 4:
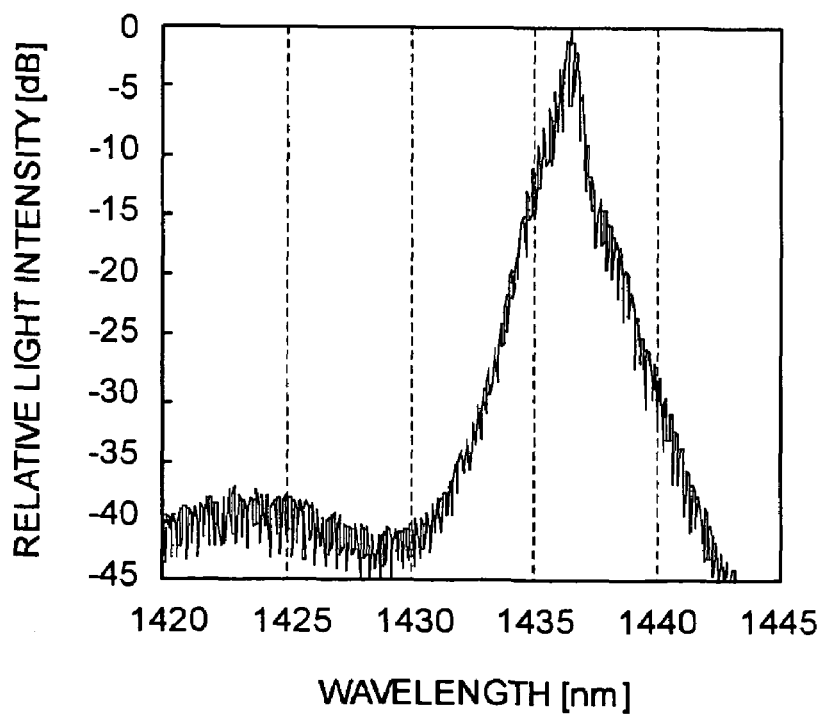
FIG. 4 is a spectrum of a light beam output from a semiconductor laser module that includes a wavelength stabilizing fiber grating and forms an external resonator.

FIG. 4 is a spectrum of a light beam output from a semiconductor laser module that includes a wavelength stabilizing fiber grating and forms an external resonator. This semiconductor laser module is typically used in the Raman amplification of a light signal that has a wavelength in the range of 1.55 μm. The spectral form of the transmitted light beam can be approximated by the equality (1):

$$A(|\omega'|)^2 = \exp\left\{-\ln(2) \cdot \left|\frac{2\omega'}{w}\right|\right\}, \left(\frac{w}{2\pi} = 145 \text{ GHz}\right), \quad (1)$$

$$\frac{\Delta\omega}{2\pi} = 33 \text{ GHz}$$

When the light beam output from the laser light source 1 is a linearly-polarized light beam that has the spectrum as shown in FIG. 3, the electric field intensity is determined by the equality (2):

$$E_i(t) = \frac{E_0}{\sqrt{2}}[\exp(j\omega t) + \quad (2)$$

$$\sum_{k=1}^{n}\{A(|k \cdot \Delta\omega|)\exp\{j(\omega + k \cdot \Delta\omega)(t + \delta_k^+)\} +$$

$$A(|k \cdot \Delta\omega|)\exp\{j(\omega - k \cdot \Delta\omega(t + \delta_k^-)\}\}]$$

$$(i = x, y)$$

In the equality (2), x and y represent two orthogonal axes that are inclined at 45° with respect to the axis of linear polarization, $E_x(t)$ and $E_y(t)$ represent the electric field intensity of the respective axis components, j represents an imaginary unit, $E_0$ represents the electric field intensity of the central angular frequency, and $\delta^+_k$ and $\delta^-_k$ represent the initial phases of the respective components.

When the mode interval angular frequency of the light beam is considered to be Δω, the polarization dispersion device 3 effects a polarization mode dispersion τ on the light beam that is not in the vicinity of (2π/Δω) and generates a time lag equivalent to the polarization mode dispersion τ between the two polarization components.

More specifically, the polarization mode dispersion τ is determined as follows. The electrical field intensity of the transmitted light beam 102 which has been effected with the polarization mode dispersion τ by the polarization dispersion device 3 can be expressed as $E_x(t)$ and $E_y(t+\tau)$. The degree of polarization (DOP) is determined by the equality (3):

$$DOP = \frac{\sqrt{|S_1|^2 + |S_2|^2 + |S_3|^2}}{S_0} \quad (3)$$

In the equality (3), $S_0$, $S_1$, $S_2$, and $S_3$ represent the Stokes parameters that represent the polarization condition and are respectively determined by the inequalities (4), (5), (6), and (7), where < ... > represents a time average while $E^*_x$ and $E^*_y$ represent a complex conjugate.

$$S_o = <E_x^*E_x + E_yE_y^*> \quad (4)$$

$$= \left(\frac{E_0}{\sqrt{2}}\right)^2\left\{1 + \sum_{k=1}^{n}(A(|k \cdot \Delta\omega|)^2 \times 2)\right\} \times 2$$

$$S_1 = <E^*_xE_x - E_yE^*_y> = 0 \quad (5)$$

$$S_2 = <E_x^*E_x + E_yE_y^*> = \left(\frac{E_0}{\sqrt{2}}\right)^2 \cdot 2[\cos(\omega\tau) + \quad (6)$$

$$\sum_{k=1}^{n}A(|k \cdot \Delta\omega|)^2\{\cos\{(\omega + k \cdot \Delta\omega)\tau\} + \cos\{(\omega - k \cdot \Delta\omega)\tau\}\}]$$

$$S_3 = <E_x^*E_y - E_xE_y^*> = \left(\frac{E_0}{\sqrt{2}}\right)^2 \cdot (2j)[\sin(\omega\tau) + \quad (7)$$

$$\sum_{k=1}^{n}A(|k \cdot \Delta\omega|^2)\{\sin\{(\omega + k \cdot \omega)\tau\} + \sin\{(\omega - k \cdot \Delta\omega)\tau\}\}]$$

When the equality (3) is solved using the inequalities (4), (5), (6), and (7), the equality (8) is obtained.

$$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

In other words, the polarization mode dispersion τ effected by the polarization dispersion device 3 is set such that the degree of polarization (DOP) obtained with the equality (8) is less. As a result, even when the optical path difference between the two polarization modes of the pump light is less than the coherent length, the light beam 102 that is not polarized can be obtained.

Figure 5:
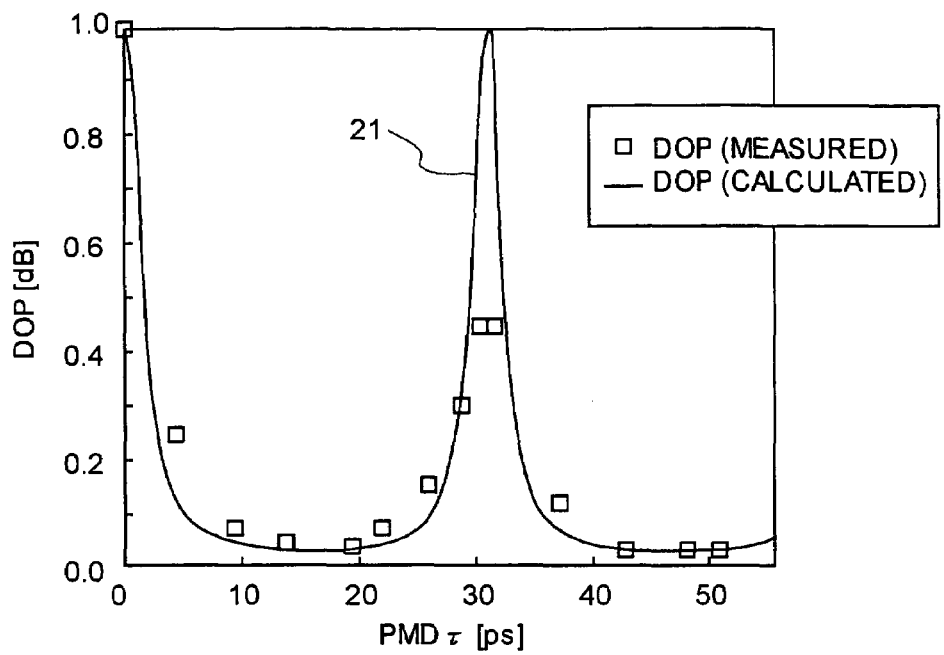
FIG. 5 is a characteristic diagram that illustrates the relation between a polarization mode dispersion $\tau$ effected by the polarization dispersion device and a degree of polarization (DOP)

FIG. 5 is a characteristic diagram that illustrates the relation between a polarization mode dispersion τ effected by the polarization dispersion device and a degree of polarization. The horizontal axis represents the polarization mode dispersion (PMD) τ (unit: ps) and the vertical axis represents the degree of polarization (unit: db).

The curve 21 represents DOP calculated (hereafter, "calculated values) using the equality (8), when the spectral of the light beam output from the laser light source 1 satisfies the equality (1). The boxes represent DOP measured (hereafter, "measured values).

The measured values and the calculated values show a peak near the polarization mode dispersion τ of 30 ps. This indicates that the coherence of the light of the vertical mode is not lost. The polarization mode dispersion τ, which effects the optical path difference corresponding to a coherent length of about 2 cm having the vertical mode of the full width at half maximum of 10 GHz, is 100 ps. However, even if the polarization mode dispersion τ is much less than 100 ps, the calculated values can be reduced by selecting appropriate conditions, that is to say polarization can be eliminated. Moreover, the polarization can be eliminated when the polarization mode dispersion τ is in the range of 10 ps to 20 ps. This range is equivalent to a polarization maintaining fiber of the length of at the most 20 m. However, this length is small enough to be used practically so that the amount of light loss in the polarization maintaining fiber or the cost and the implementation capacity do not pose any major problem.

Figure 6:
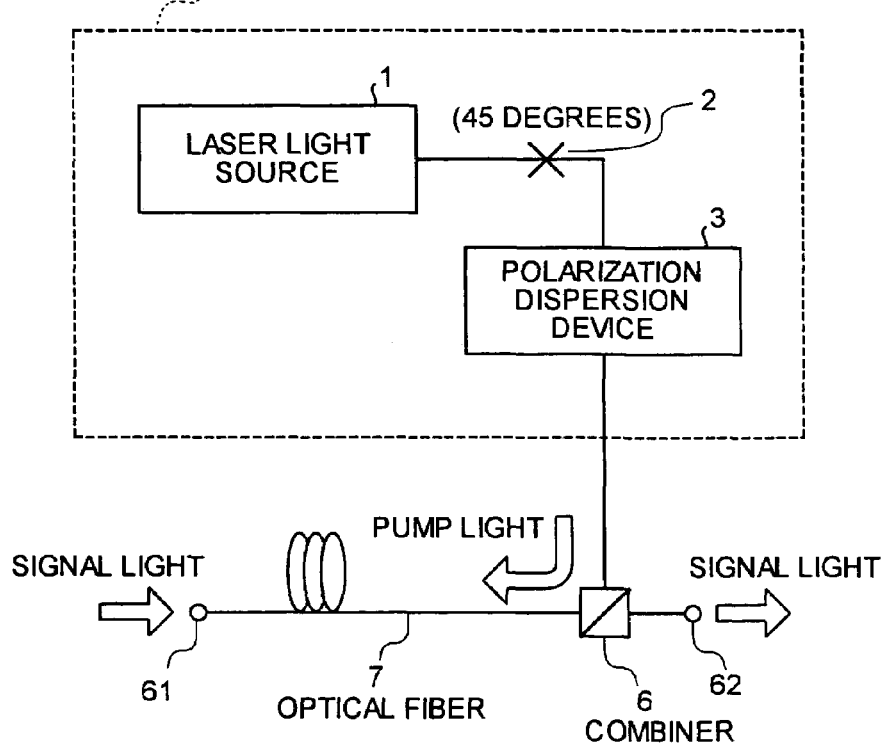
FIG. 6 is a schematic diagram of a Raman amplifier according to a second embodiment of the present invention.

FIG. 6 is a schematic diagram of the Raman amplifier according to a second embodiment of the present invention. A signal light is carried through an optical fiber 7, which is a Raman-amplifying medium, from an input terminal 61 towards an output terminal 62. A combiner 6 is provided between the terminals 61 and 62 on the optical fiber 7. This combiner 6 injects a pump light, which is a Raman pump light, transmitted from a non-polarized pump light source 5 into the optical fiber 7 in a direction opposite to the direction of propagation of the light signal. The non-polarized pump light source 5 has the configuration shown in FIG. 1.

Thus, as the non-polarized pump light is injected into the optical fiber 7, the polarization-dependency of the Raman gain in the optical fiber 7 can be reduced. The combiner 6 may be an optical fiber fused type WDM coupler, which is formed by using the difference between the wavelengths of the light signal and the pump light, or a filter, which uses a dielectric coat.

Figure 7:
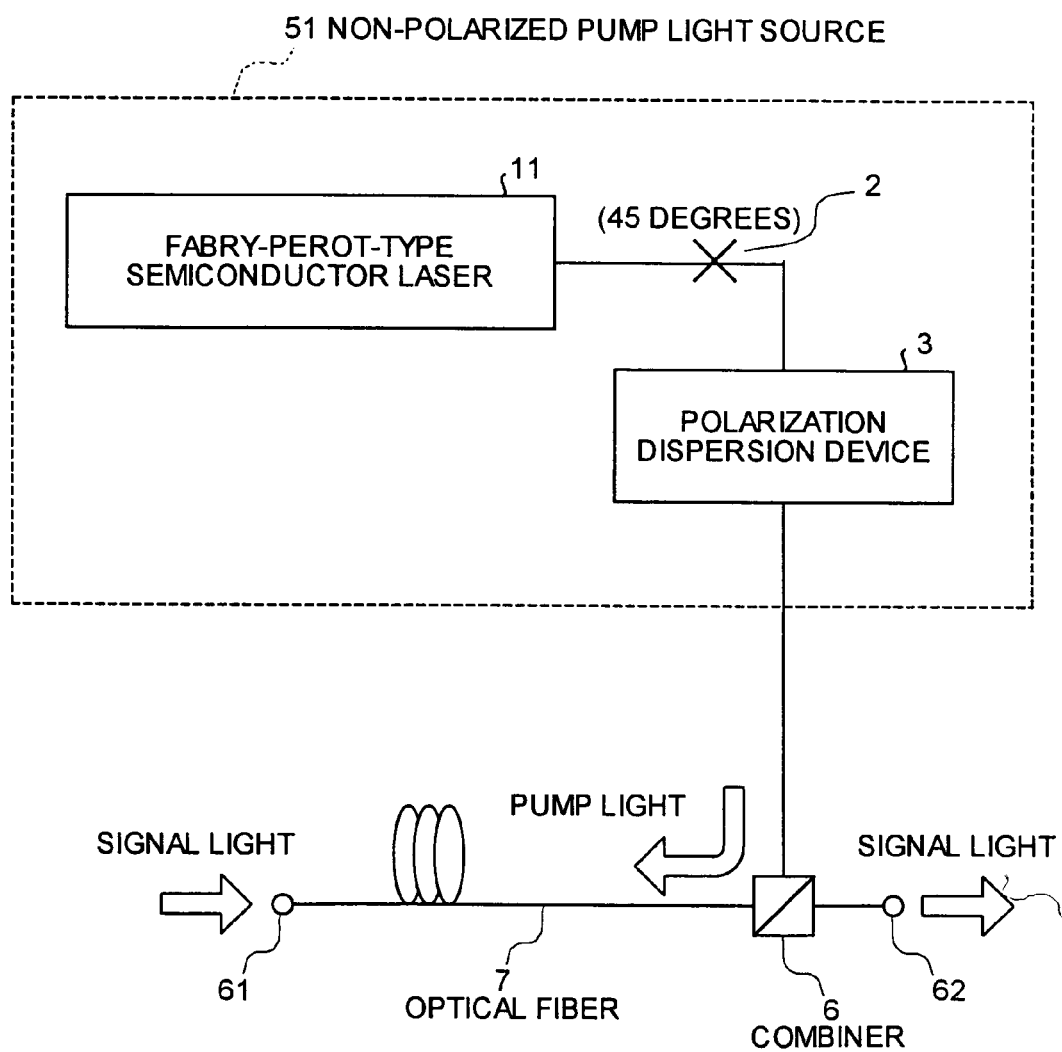
FIG. 7 is a schematic diagram of a Raman amplifier according to a third embodiment of the present invention.

FIG. 7 is a schematic diagram of the Raman amplifier according to a third embodiment of the present invention. The parts in FIG. 7 that have same or similar configuration or that perform same or similar functions to those in FIG. 6 are assigned with the same reference numerals.

The Raman amplifier according to the third embodiment includes a non-polarized pump light source 51 instead of the non-polarized pump light source 5 shown in FIG. 6. The non-polarized pump light source 51 includes a Fabry-Perot-type semiconductor laser device 11 as laser light source. Even in this Raman amplifier the polarization-dependency of the Raman gain in the optical fiber 7 can be reduced.

Figure 8:
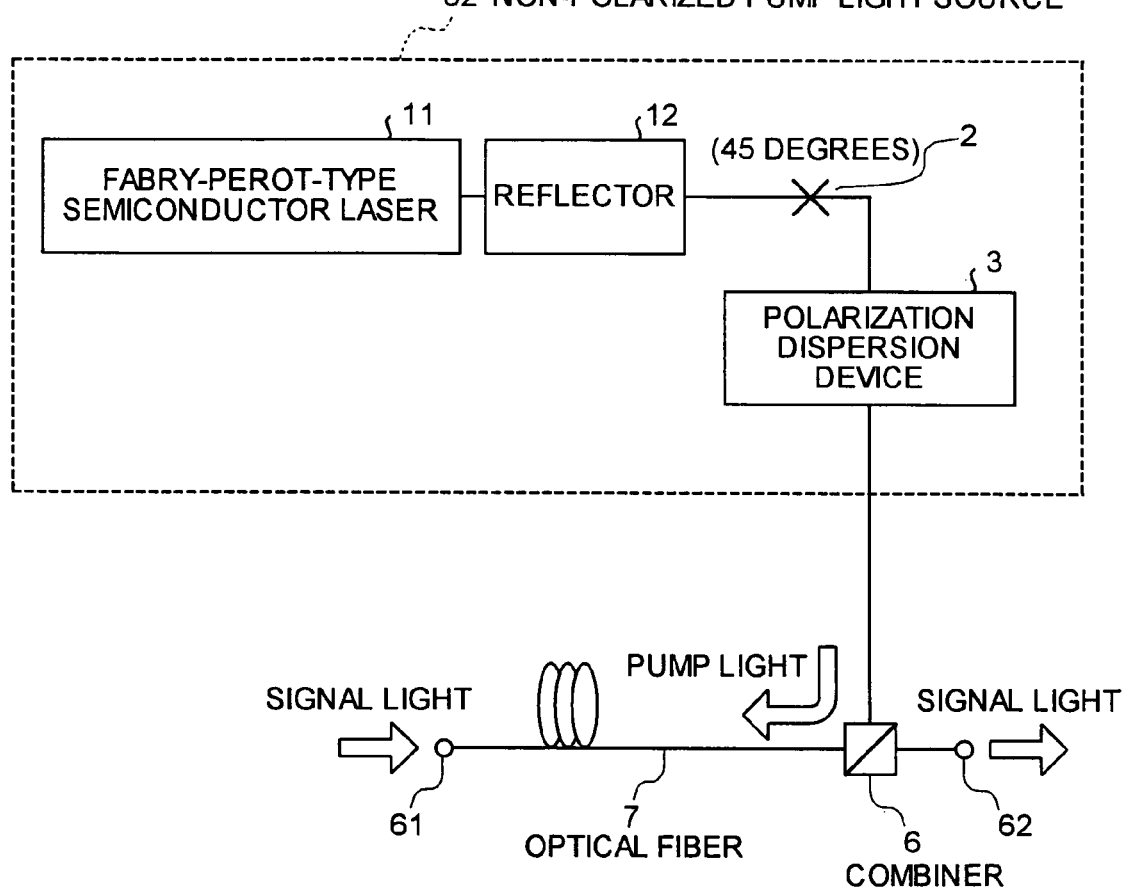
FIG. 8 is a schematic diagram of a Raman amplifier according to a fourth embodiment of the present invention.

FIG. 8 is a schematic diagram of the Raman amplifier according to a fourth embodiment of the present invention. The parts in FIG. 8 that have same or similar configuration or that perform same or similar functions to those in FIG. 7 are assigned with the same reference numerals.

The Raman amplifier according to the fourth embodiment includes a non-polarized pump light source 52 instead of the non-polarized pump light source 51 shown in FIG. 7. This non-polarized pump light source 52 includes a reflector 12 that is provided between the Fabry-Perot-type semiconductor laser device 11 and the polarization dispersion device 3.

The reflector 12 wavelength-selectively reflects a portion of the light beam output from the Fabry-Perot-type semiconductor laser device 11 to thereby form an external resonator along with the Fabry-Perot-type semiconductor laser device 11.

As a result, the reflection wavelength, which is stable, of the reflector 12 can be set as the oscillation wavelength of the Fabry-Perot-type semiconductor laser device 11. Thus, the effects of the variation in the temperature and other driving conditions on the central wavelength of the Fabry-Perot-type semiconductor laser device 11 can be reduced. Although the Raman amplifier according to the fourth embodiment additionally requires the reflector 12, the desired effect can be achieved.

The reflector 12 may be a fiber grating. FIG. 4 illustrates the spectrum when the reflector 12 is the fiber grating. The reflector 12 may be an etalon filter or a grating of a bulk component, etc.

Figure 9:
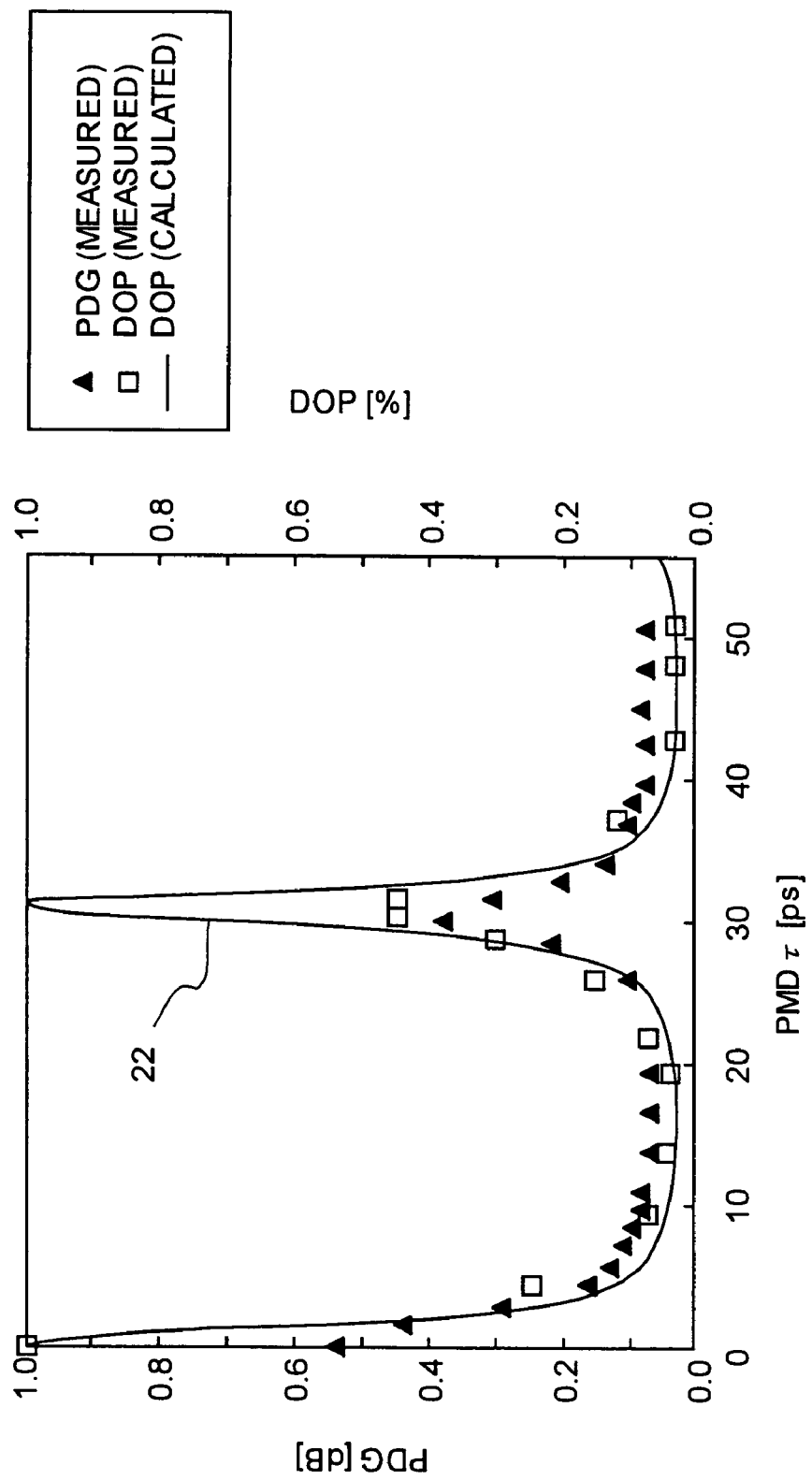
FIG. 9 is a characteristic diagram that illustrates the relation between a polarization mode dispersion $\tau$ and a degree of polarization effected by the polarization dispersion device in the pump light source (non-polarized light source) shown in FIG. 8, and a polarization-dependent gain (PDG) of the Raman gain.

FIG. 9 is a characteristic diagram that illustrates the relation between the polarization mode dispersion τ and the degree of polarization effected by the polarization dispersion device 3 in the non-polarized pump light source 52 shown in FIG. 8, and the polarization-dependent gain (PDG) of the Raman gain. The horizontal axis represents the PMD (unit: ps) and the vertical axes represent the PGD and the DOB (unit: db).

The curve 22 is a plot of the calculated values of the DOP determined from the equality (8), when the spectral form of the transmitted light beam of the Fabry-Perot-type semiconductor laser device 11 satisfies the equality (1). The boxes represent the measured values of the DOP. The solid triangles represent the measured values of the PDG of the Raman gain.

The measured values and the calculated values show a peak near the polarization mode dispersion τ of 30 ps. Consequently, in the non-polarized pump light source 52, by properly setting the polarization mode dispersion τ effected by the polarization dispersion device 3 in the range of the optical path difference that is smaller than the coherent length of the non-polarized pump light source 52, the polarization of the pump light can be eliminated. As a result, the polarization-dependency of the Raman gain can be reduced.

In this way, according to the fourth embodiment, similar to the second and third embodiments, polarization-dependency of the Raman gain in the optical fiber 7 can be reduced as the non-polarized pump light is used. In addition, as the reflector 12 is provided and the external resonator is fabricated, the stable reflection wavelength of the reflector 12 can be set as the oscillation wavelength of the Fabry-Perot-type semiconductor laser device 11. Thus, the effect of the variation in the temperature and other driving conditions on the central wavelength of the Fabry-Perot-type semiconductor laser device 11 can be reduced.

As the polarization dispersion device 3, a structure that separates the two polarization components and actually effects the optical path difference may be used. Alternatively, a polarization maintaining fiber or a crystal that has a birefringence characteristic may be used.

Figure 10:
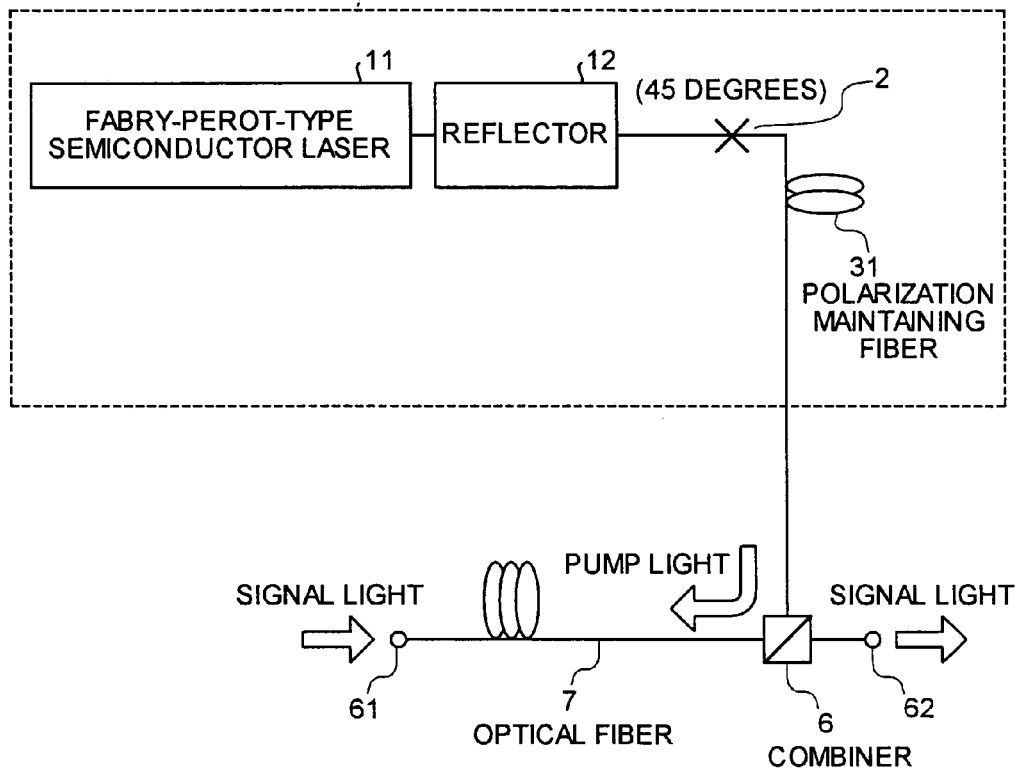
FIG. 10 is a schematic diagram of a Raman amplifier according to a fifth embodiment of the present invention.

FIG. 10 is a schematic diagram of the Raman amplifier according to a fifth embodiment of the present invention. The parts in FIG. 10 that have same or similar configuration or that perform same or similar functions to those in FIG. 8 are assigned with the same reference numerals.

The Raman amplifier according to the fifth embodiment includes a non-polarized pump light source 53 instead of the non-polarized pump light source 52 shown in FIG. 8. Moreover, this Raman amplifier includes a polarization maintaining fiber 31 instead of the polarization dispersion device 3 shown in FIG. 8.

As a typical characteristic of the polarization maintaining fiber 31, the polarization dispersion of about 1 meter of the polarization maintaining fiber 31 is about 1.4 ps and a fiber length of 10 meters can effect a polarization dispersion of about 14 ps. Consequently, according to the fifth embodiment, a polarization-independent Raman amplifier can be realized that is practical in terms of compactness, stable operation, and reliability.

Figure 11:
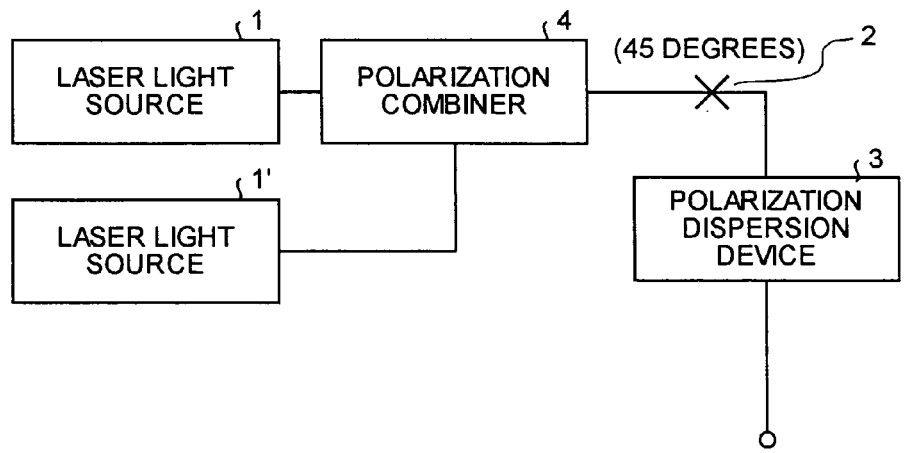
FIG. 11 is a schematic diagram of a non-polarized light source according to a sixth embodiment of the present invention.

FIG. 11 is a schematic diagram of the non-polarized light source according to a sixth embodiment of the present invention. The parts in FIG. 11 that have same or similar configuration or that perform same or similar functions to those in FIG. 1 are assigned with the same reference numerals.

The non-polarized light source according to the sixth embodiment includes a laser light source 1' and a polarization combiner 4 in addition to structure shown in FIG. 1. The polarization combiner 4 polarization-combines the light beam output from the laser light sources 1 and 1'. The output lights, which are mutually orthogonal, of the polarization combiner 4 are input into the polarization dispersion device 3. As a result, an incident angle of the light beams from both the laser light sources with respect to the polarization dispersion device 3 can be set as the polarization angle 105 at 45° (see FIG. 2).

According to this structure, the transmitted light beams of both the laser light sources 1 and 1' can be simultaneously non-polarizing if the polarization mode dispersion effected by the polarization dispersion device 3 is set such that the degree of polarization (DOP) is reduced in the equality (8).

The two laser light sources 1 and 1' may have a different central wavelength. Even in that case, the transmitted light beam of both the laser light sources 1 and 1' can be non-polarizing. Moreover, even if there is a large difference in the intensity of the transmitted light beam of the two laser light sources 1 and 1', non-polarization can be carried out. If during the operation, one of the two laser light sources 1 and 1' fails, then only the output decreases and deterioration of the degree of polarization is avoided. In this case, a backup laser light source, which is provided in case of a failure, is used as a cold standby.

Figure 12:
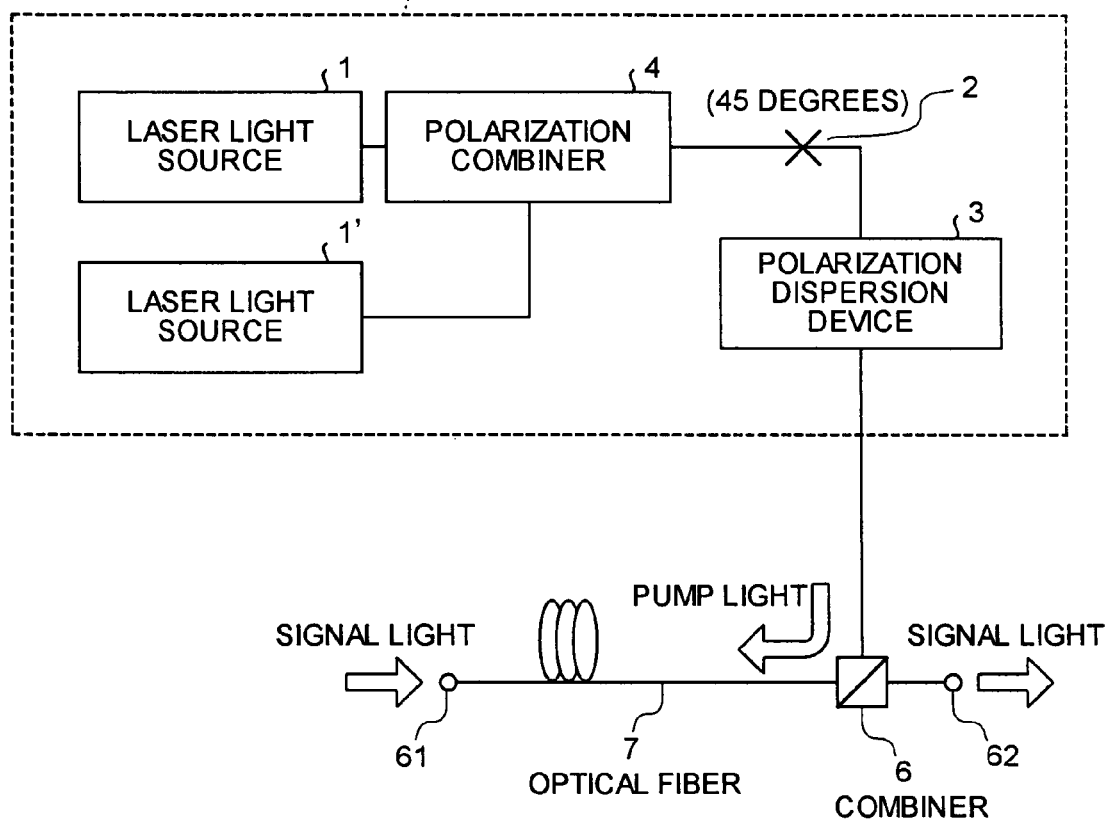
FIG. 12 is a schematic diagram of a Raman amplifier according to a seventh embodiment of the present invention.

FIG. 12 is a schematic diagram of the Raman amplifier according to a seventh embodiment of the present invention.

A signal light is carried through an optical fiber 7, which is a Raman-amplifying medium, from an input terminal 61 towards an output terminal 62. A combiner 6 is provided between the terminals 61 and 62 on the optical fiber 7. This combiner 6 injects a pump light, which is a Raman pump light, transmitted from a non-polarized pump light source 54 into the optical fiber 7 in a direction opposite to the direction of propagation of the light signal. The non-polarized pump light source 54 has the configuration shown in FIG. 11.

Thus, as the non-polarized pump light is injected into the optical fiber 7, the polarization-dependency of the Raman gain in the optical fiber 7 can be reduced. The combiner 6 may be an optical fiber fused type WDM coupler, which is formed by using the difference between the wavelengths of the light signal and the pump light, or a filter, which uses a dielectric coat.

Even if the central wavelength of two laser light sources 1 and 1' is different, the transmitted light beam of both the laser light sources 1 and 1' can be non-polarizing. Thus, in order to reduce the polarization-dependency of the Raman gain, the non-polarized pump light source 54 can pump the light in two wavelengths. Even if only one of the light sources emits the light and the operation is carried out when the intensity of the pump light that contributes to the Raman amplification is low, the polarization-dependency of the Raman gain can be maintained at a reduced level, as the degree of polarization (DOP) of the pump light is less.

Figure 13:
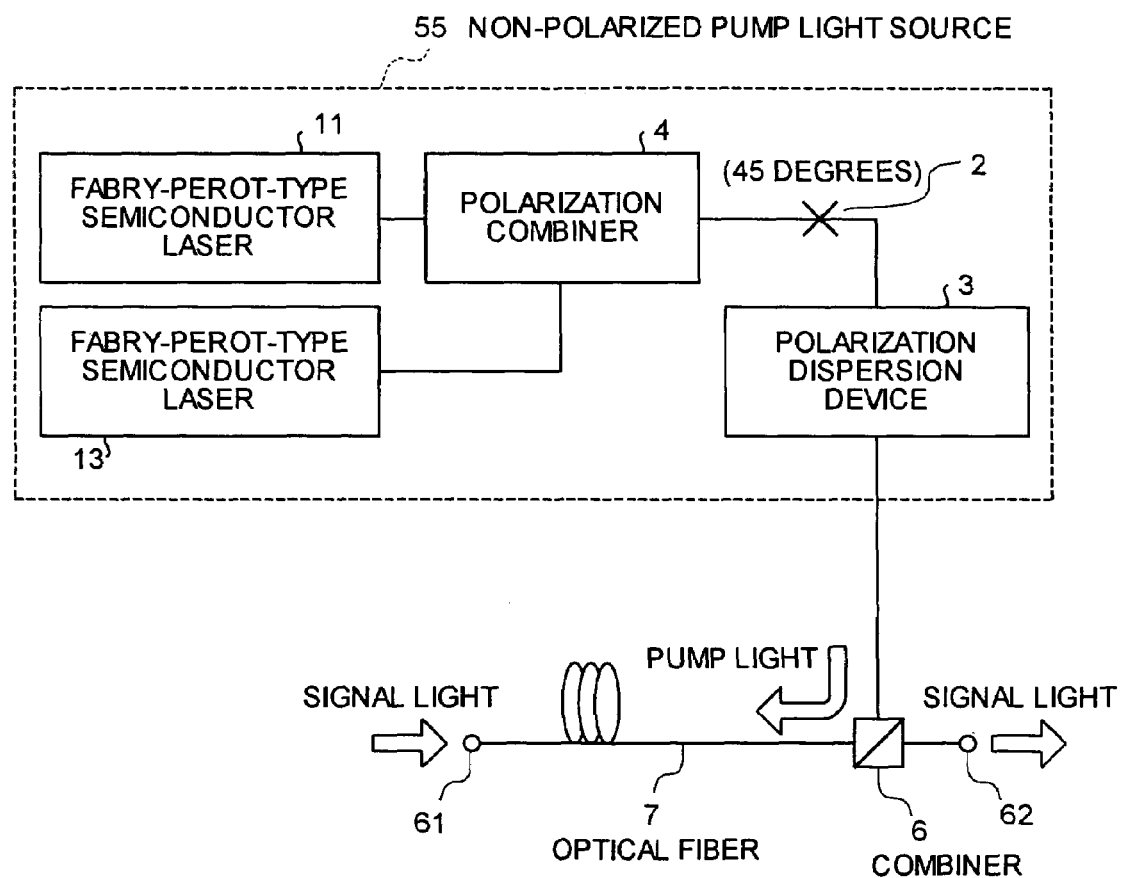
FIG. 13 is a schematic diagram of a Raman amplifier according to an eighth embodiment of the present invention.

FIG. 13 is a schematic diagram of the Raman amplifier according to an eighth embodiment of the present invention. The parts in FIG. 13 that have same or similar configuration or that perform same or similar functions to those in FIG. 12 are assigned with the same reference numerals.

The Raman amplifier according to the eighth embodiment includes a non-polarized pump light source 55 instead of the non-polarized pump light source 54 shown in FIG. 12. The non-polarized pump light source 55 includes Fabry-Perot-type semiconductor lasers 11 and 13 as laser light sources. Even in this Raman amplifier the polarization-dependency of the Raman gain in the optical fiber 7 can be reduced.

Figure 14:
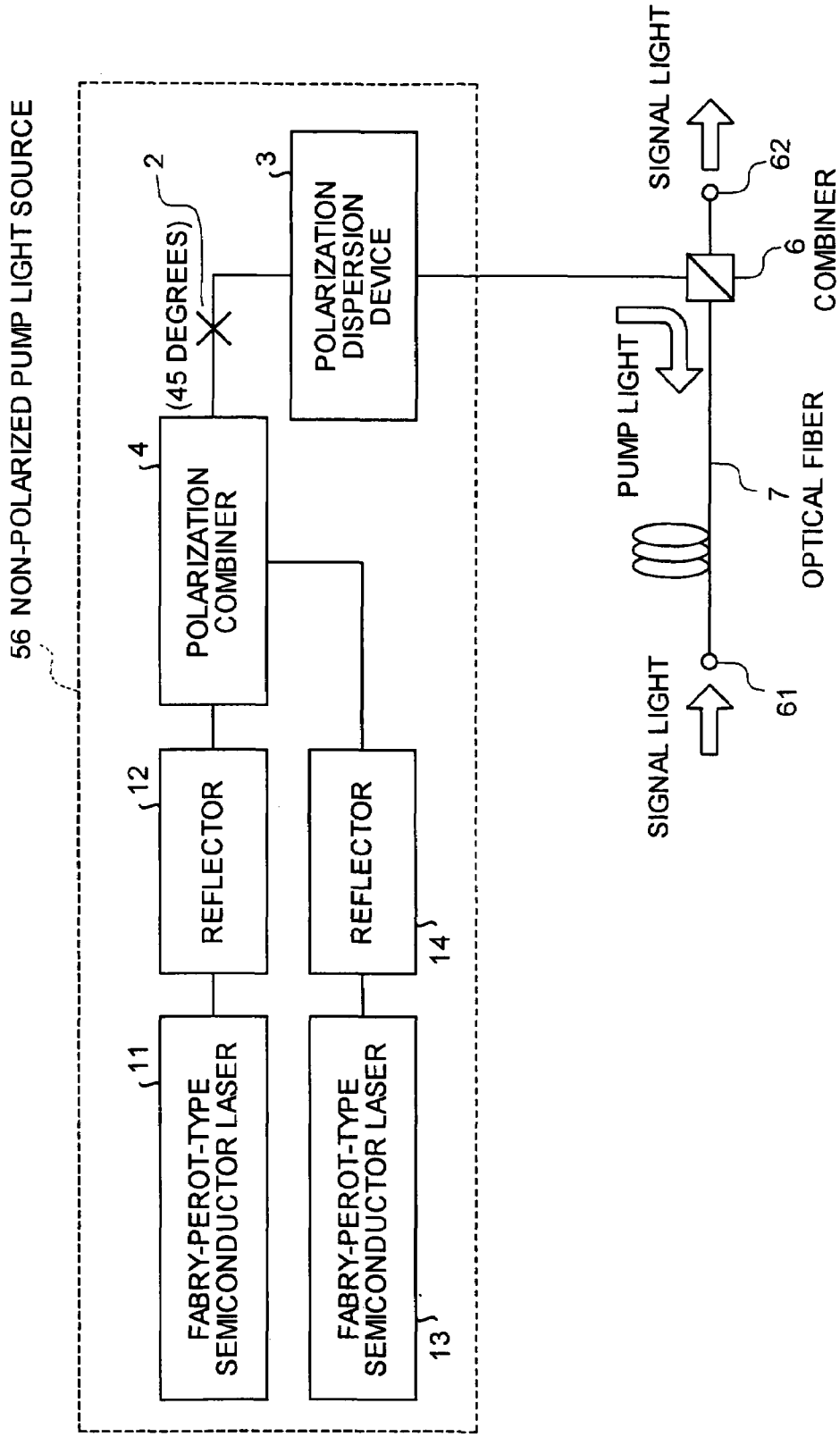
FIG. 14 is a schematic diagram of a Raman amplifier according to a ninth embodiment of the present invention.

FIG. 14 is a schematic diagram of the Raman amplifier according to a ninth embodiment of the present invention. The parts in FIG. 14 that have same or similar configuration or that perform same or similar functions to those in FIG. 13 are assigned with the same reference numerals.

The Raman amplifier according to the ninth embodiment includes a non-polarized pump light source 56 instead of the non-polarized pump light source 55 shown in FIG. 12. The non-polarized pump light source 56 includes reflectors 12 and 14 and a polarization combiner 4 in addition to the structure shown in FIG. 13.

The reflectors 12 and 14 wavelength-selectively reflect a portion of the transmitted light beam of the Fabry-Perot-type semiconductor laser devices 11 and 13 and form an external resonator along with the Fabry-Perot-type semiconductor laser devices 11 and 13.

As a result, the stable reflection wavelength of the reflectors 12 and 14 can be set as the oscillation wavelength of the Fabry-Perot-type semiconductor laser devices 11 and 13. Thus, the effects of the variation in the temperature and other driving conditions on the central wavelength of the Fabry-Perot-type semiconductor laser devices 11 and 13 can be reduced. This more than compensates for the demerit of increasing the number of parts. Consequently, according the ninth embodiment, a stable Raman amplifier with low polarization-dependency can be obtained.

Figure 15:
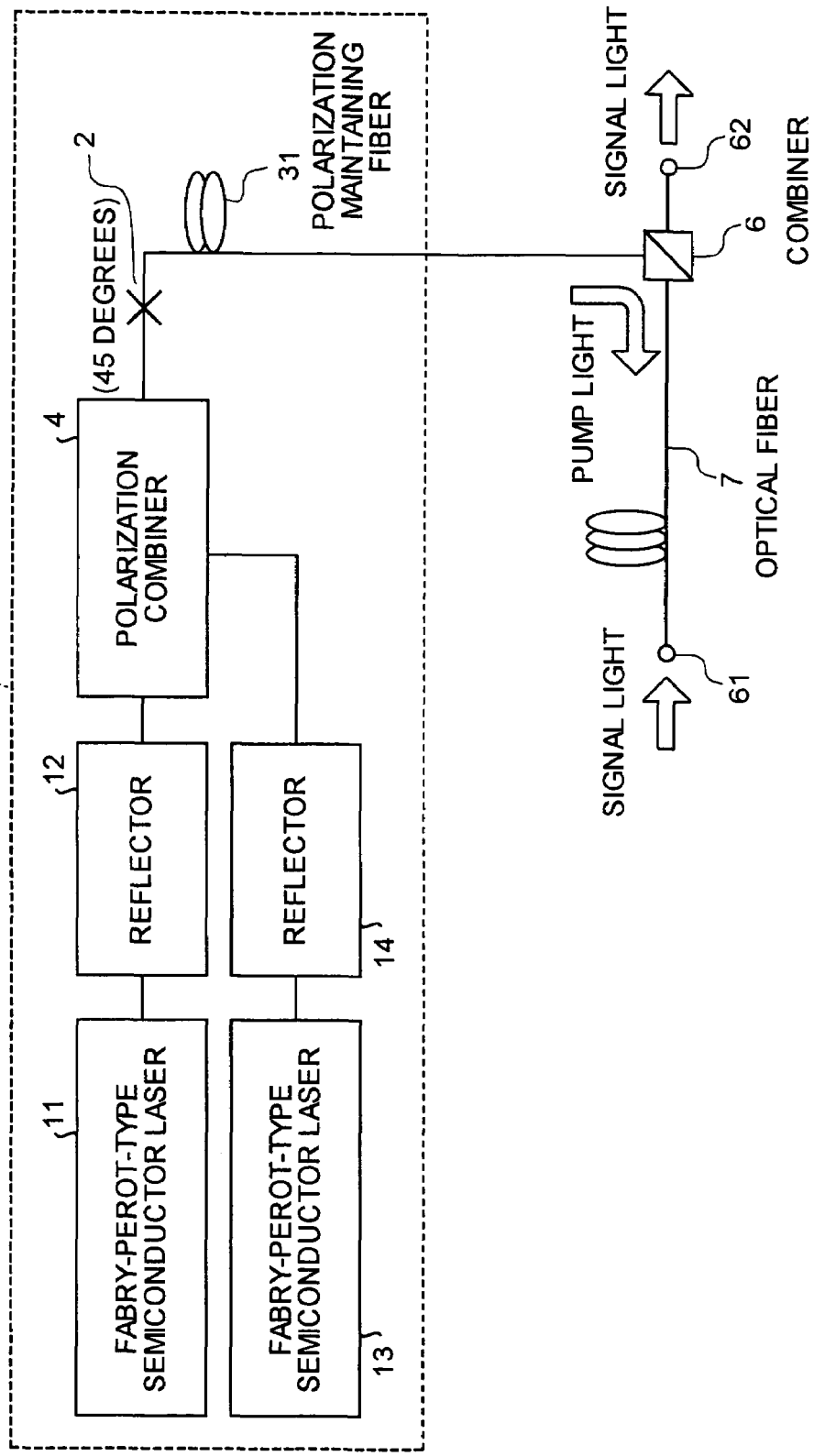
FIG. 15 is a schematic diagram of a Raman amplifier according to a tenth embodiment of the present invention.

FIG. 15 is a schematic diagram of the Raman amplifier according to a tenth embodiment of the present invention.

The parts in FIG. 15 that have same or similar configuration or that perform same or similar functions to those in FIG. 14 are assigned with the same reference numerals.

The Raman amplifier according to the tenth embodiment includes a non-polarized pump light source 57 instead of the non-polarized pump light source 56 shown in FIG. 14. A polarization maintaining fiber 31 is provided in the non-polarized pump light source 57 instead of the polarization dispersion device 3 in the non-polarized pump light source 56 shown in FIG. 14.

As a typical characteristic of the polarization maintaining fiber 31, the polarization dispersion of about 1 meter is about 1.4 ps and a fiber length of 10 meters can effect a polarization dispersion of about 14 ps. Consequently, according to the tenth embodiment, as in the fifth embodiment, a polarization-independent Raman amplifier can be achieved that is practical in terms of compactness, stable operation, and reliability.

Figure 16:
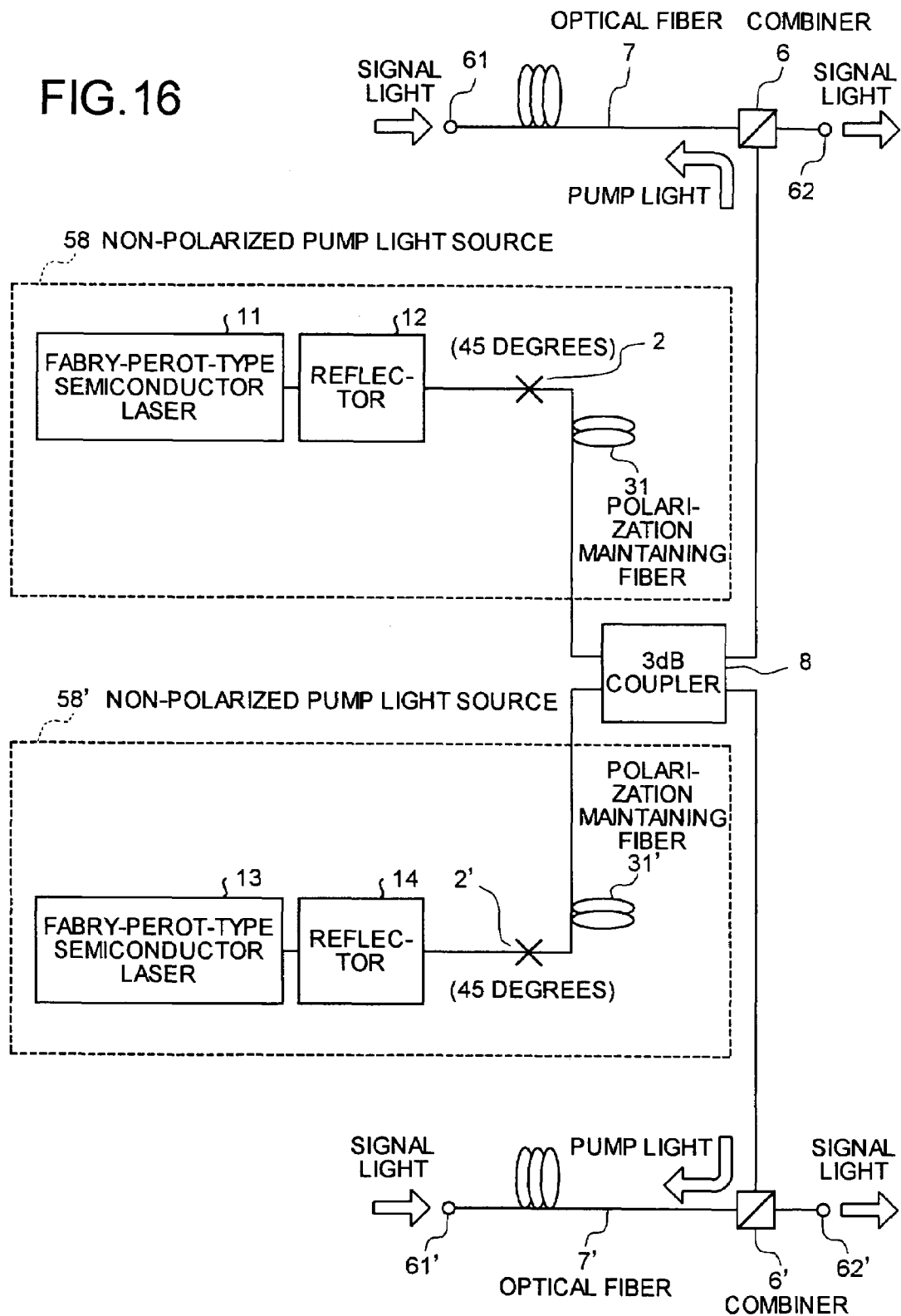
FIG. 16 is a schematic diagram of a Raman amplifier according to an eleventh embodiment of the present invention.

FIG. 16 is a schematic diagram of the Raman amplifier according to an eleventh embodiment of the present invention. The parts in FIG. 16 that have same or similar configuration or that perform same or similar functions to those in FIG. 10 are assigned with the same reference numerals. In the Raman amplifier according to the eleventh embodiment includes two Raman amplifiers having a structure that is same as that shown in FIG. 10.

Non-polarized pump light sources 58 and 58' have a structure that is same as that of the non-polarized light source 53 shown in FIG. 10. In other words, the non-polarized pump light source 58 includes the Fabry-Perot-type semiconductor laser device 11, the reflector 12, and the polarization maintaining fiber 31. Similarly, the non-polarized pump light source 58' comprises a Fabry-Perot-type semiconductor laser device 13, a reflector 14, a node 2', and a polarization maintaining fiber 31'. Correspondingly, two optical fibers 7 and 7' that are Raman-amplifying media and a 3 dB coupler 8 are provided.

The transmitted light beams of the two non-polarized pump light sources 58 and 58' are combined once in the 3 dB coupler 8. One of the transmitted light beams from the 3 dB coupler 8 is input into the optical fiber 7 via the combiner 6 in a direction opposite to the propagation direction (from the input end 61 towards the output end 62) of the light signal, thus forming a first Raman amplifier. The other transmitted light beam from the 3 dB coupler 8 is input into the optical fiber 7' via a combiner 6' in a direction opposite to the propagation direction (from an input end 61' towards an output end 62') of the light signal, thus forming a second Raman amplifier.

According to this structure, even if one of the two Fabry-Perot-type semiconductor laser devices fails, the transmitted light beam of the other Fabry-Perot-type semiconductor laser device is equally supplied to the two optical fibers 7 and 7'. Hence, deterioration in the pump light due to the failure can be checked and the reliability of the Raman amplifier can be improved.

The non-polarized light sources as in the structure shown in FIG. 1 can be used instead of the non-polarized pump light sources 58 and 58'. In addition, the non-polarized light sources as in the structure shown in FIG. 11 can also be used. In other words, a total of four Fabry-Perot-type semiconductor laser devices can be used.

Figure 17:
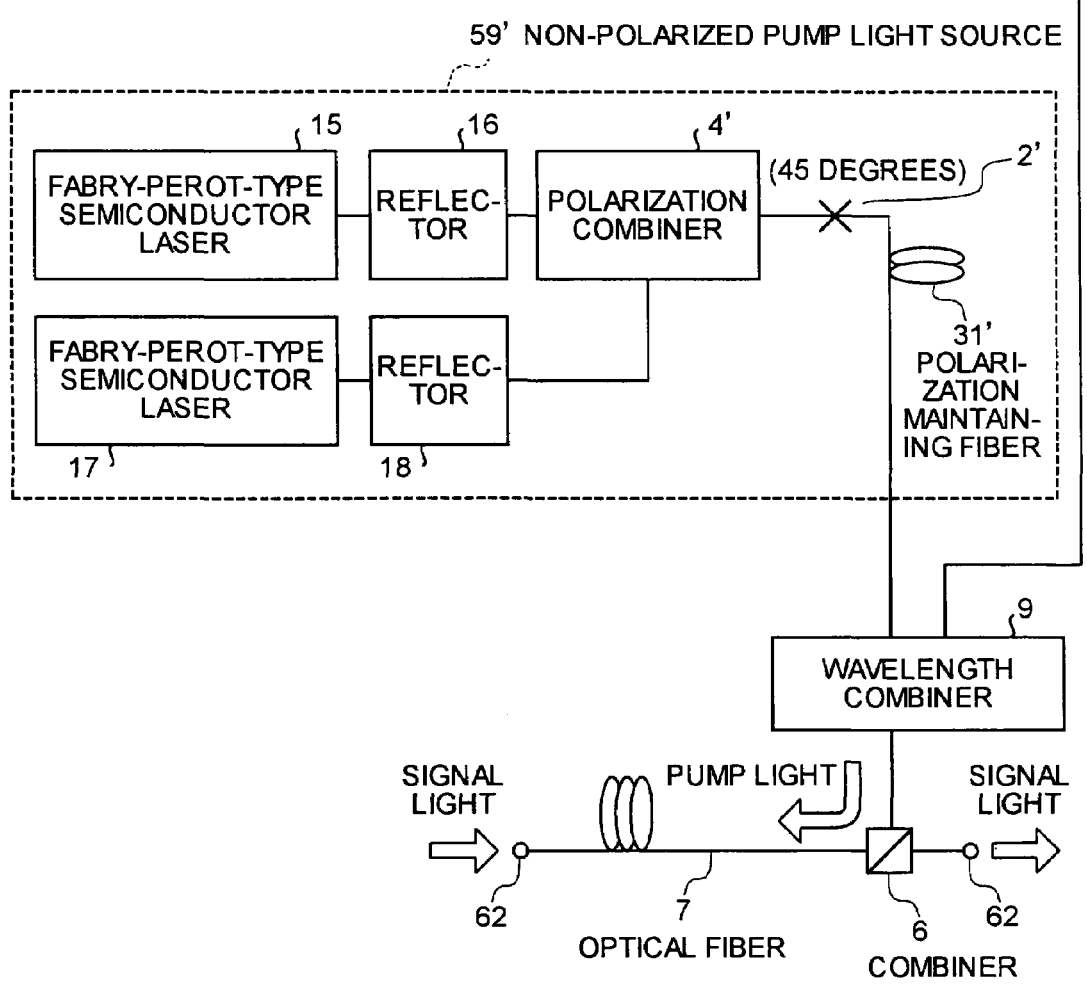
FIG. 17 is a schematic diagram of a Raman amplifier according to a twelfth embodiment of the present invention.

FIG. 17 is a schematic diagram of the Raman amplifier according to a twelfth embodiment of the present invention. The parts in FIG. 17 that are identical or equivalent to those in FIG. 15 are assigned the same reference numerals. A variation of the Raman amplifier according to the tenth embodiment (FIG. 15) is disclosed in the Raman amplifier according to the twelfth embodiment of the present invention.

In FIG. 17, non-polarized pump light sources 59 and 59' have an identical structure to the non-polarized pump light source 57 according to the tenth embodiment (FIG. 15) of the present invention. In other words, the non-polarized pump light source 59 comprises Fabry-Perot-type semiconductor laser devices 11 and 13, reflectors 12 and 14, and a polarization maintaining fiber 31. Similarly, the non-polarized pump light source 59' comprises Fabry-Perot-type semiconductor laser devices 15 and 17, reflectors 16 and 18, and a polarization maintaining fiber 31'. However, the transmitted light beams of the non-polarized pump light sources 59 and 59' have different central wavelengths. Correspondingly, a wavelength combiner 9 is provided.

The transmitted light beams of the non-polarized pump light sources 59 and 59' are wavelength-combined in the wavelength combiner 9 and input into the optical fiber 7 via the combiner 6 in a direction opposite to the propagation direction of the light signal and thus forming a Raman amplifier.

According to this structure, a pump light of four different wavelengths can be used. Hence, it is possible to even out the amplification gain for a wide range of signal wavelengths or achieve a high-gain Raman amplification characteristic by means of a strong pump light corresponding to the number of semiconductor laser devices used.

In each embodiment described above, a rear-facet pump structure was explained in which the pump light of a Raman amplifier is carried through an optical fiber in a direction opposite to the propagation direction of the light signal. However, even if a front-facet pump structure is used, in which the pump light is carried in the same direction as that of the light signal, it is clear that the non-polarized pump light according to the present invention can be used and the light signal polarization-dependency of the Raman gain can be reduced.

In the above description, the laser device and the other optical parts that constitute a pump light source are connected using optical fibers. However, the connecting medium need not necessarily be limited to optical fibers. The same results can be achieved with any medium that can carry light signals.

As described above, according to the present invention, a laser light source transmits a virtually linearly-polarized light beam that has plural mode components arranged at an interval of an almost equal angular frequency. A polarization dispersion device is connected to the laser light source in such a way that the polarization axis of the polarization dispersion device meets the polarization axis of the light beam output from the laser light source to form a 45° angle. The polarization dispersion device effects on the light beam output from the laser light source a polarization mode dispersion that is not in the vicinity of ($2\pi/\Delta\omega$), where $\Delta\omega$ is the mode interval angular frequency. As a result, even when the optical path difference between the two polarization modes is less that the coherent length, non-polarization of the transmitted light beam can be carried out.

According to the next invention, a laser light source transmits a virtually linearly-polarized light beam that has plural mode components arranged at an interval of an almost equal angular frequency. A polarization dispersion device is connected to the laser light source in such a way that the polarization axis of the polarization dispersion device meets the polarization axis of the light beam output from the laser light source to form a 45° angle. The polarization dispersion device effects on the light beam output from the laser light source a polarization mode dispersion τ such that the degree of polarization (DOP) determined by the equality (8) given below is less than 0.5 for a function A(ω') of spectral form of a relative angular frequency ω'=ω−ωc of the angular frequency ω that has a mode interval angular frequency Δω and a central angular frequency ωc as criteria.

$$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

As a result, even when the optical path difference between the two polarization modes is less that the coherent length, non-polarization of the transmitted light beam can be carried out.

According to the next invention, in the above invention, a Fabry-Perot-type semiconductor laser device is used in the laser light source.

According to the next invention, in the above invention, a reflector is provided between the Fabry-Perot-type semiconductor laser device and the polarization dispersion device. The reflector selectively reflects a portion of the transmitted light beam of the Fabry-Perot-type semiconductor laser device and forms an external resonator. As a result, the effects of the variation in the temperature and other driving conditions on the stable reflection wavelength of the reflector and the central wavelength of the Fabry-Perot-type semiconductor laser device can be reduced.

According to the next invention, in the above invention, a polarization maintaining fiber is used instead of the polarization dispersion device.

According to the next invention, two laser light sources transmit a virtually linearly-polarized light beams that has plural mode components arranged at an interval of an almost equal angular frequency. A polarization dispersion device is connected to a polarization combining unit in such a way that the polarization axis of the polarization dispersion device meets the polarization axis of transmitted light beam of the laser light source to form a 45° angle. The polarization dispersion device effects on either of the transmitted light beams of the two laser light sources a polarization mode dispersion τ such that the degree of polarization (DOP) determined by the equality (8) given below is less than 0.5 for a function A(ω') of spectral form of a relative angular frequency ω'=ω−ωc of the angular frequency ω that has a mode interval angular frequency Δω and a central angular frequency ωc as criteria.

$$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

As a result, even when the optical path difference between the two polarization modes is less than the coherent length, non-polarization of the transmitted light beam of both the laser light sources can be carried out.

According to the next invention, in the above invention, the two laser light sources are a Fabry-Perot-type semiconductor laser devices.

According to the next invention, in the above invention, two reflectors are provided, one each between the two Fabry-Perot-type semiconductor laser devices and the polarization dispersion device. Each reflector selectively reflects a portion of the transmitted light beam of the respective Fabry-Perot-type semiconductor laser device and forms an external resonator. As a result, the effects of the variation in the temperature and other driving conditions on the stable reflection wavelength of the reflector and the central wavelength of the Fabry-Perot-type semiconductor laser device can be reduced.

According to the next invention, in the above invention, a polarization maintaining fiber is used instead of the polarization dispersion device.

According to the next invention, the non-polarized light source according to any one of the above inventions is used to generate a pump light in a wavelength band that effects the Raman gain on a light signal. The pump light is input into an optical fiber, which is a Raman-amplifying medium, by means of an injection unit. As a result, as the polarization-dependency of the Raman gain reduces, a polarization-independent Raman amplifier can be obtained.

According to the next invention, a first non-polarized light source and a second non-polarizing light according to any one of the above inventions are used to generate a pump light in a wavelength band that effects the Raman gain on the respective light signal. The transmitted light beam of the first non-polarized light source is input into a first optical fiber, which is a Raman-amplifying medium, by means of a first injection unit. The transmitted light beam of the second non-polarized light source is input into a second optical fiber, which is a Raman-amplifying medium, by means of a second injection unit. As a result, two Raman amplifiers are fabricated. However, even if one of the non-polarized light sources fails, the pump light is equally supplied to both the Raman amplifiers from the other non-polarized light source. Thus, deterioration in the pump light owing to the failure can be checked and the reliability of the Raman amplifier can be improved.

According to the next invention, plural non-polarized light sources according to any one of the above inventions are used to generate pump lights having varying central wavelengths in a wavelength band that effects a Raman gain on a light signal. The transmitted light beam of the plural non-polarized light sources having varying wavelengths is wavelength-combined in a wavelength-combining and injection unit and input into an optical fiber, which is a Raman-amplifying medium. As a result, as pump lights of varying wavelengths are used, it is possible to even out the amplification gain for a wide range of signal wavelengths or achieve a high-gain Raman gain characteristic.

INDUSTRIAL APPLICABILITY

As described above, the non-polarized light source and the Raman amplifier according to the present invention are effective in an optical transmission system, especially suitable in an apparatus aimed at reducing the polarization-dependency of the Raman gain in an optical fiber.

The invention claimed is:
1. A non-polarized light source, comprising:
a laser light source that transmits a substantially linearly-polarized light beam, the substantially linearly-polar- ized light beam having plural mode components arranged at an interval $\Delta\omega$ of substantially equal angular frequency; and a polarization dispersion device optically coupled to the laser light source in such a way that a polarization axis of the polarization dispersion device is at 45° with respect to a polarization axis of the light beam output from the laser light source, wherein the polarization dispersion device performs a polarization mode dispersion on a spectrum of frequencies of the light beam except for frequencies substantially equal to $2\pi/\Delta\omega$.

2. The non-polarized light source according to claim 1, wherein the laser light source is a semiconductor laser device having a Fabry-Perot optical resonator cavity.

3. The non-polarized light source according to claim 1, further comprising a reflector provided between the laser light source and the polarization dispersion device, wherein the reflector selectively reflects a portion of the light beam output from the laser light source and forms an external resonator.

4. A non-polarized light source, comprising:

a laser light source that transmits a substantially linearly-polarized light beam, the substantially linearly-polarized light beam having plural mode components arranged at an interval $\Delta\omega$ of substantially equal angular frequency; and a polarization dispersion device optically coupled to the laser light source in such a way that a polarization axis of the polarization dispersion device is at 45° with respect to a polarization axis of the light beam output from the laser light source, wherein the polarization dispersion device performs a polarization mode dispersion $\tau$ such that the degree of polarization, DOP, determined by the equality $$DOP = \left| \frac{1 + \sum_{n=1}^{\infty} \{2A(n \cdot \Delta\omega)^2 \cos(n \cdot \Delta\omega \cdot \tau)\}}{1 + \sum_{n=1}^{\infty} \{2A(n \cdot \Delta\omega)^2\}} \right| \quad (8)$$

is less than 0.5 for a function $A(\omega')$ of spectral form of a relative angular frequency $\omega'=\omega-\omega c$ of the angular frequency $\omega$ that has a mode interval angular frequency $\Delta\omega$ and a central angular frequency $\omega c$ as criteria.

5. The non-polarized light source according to claim 4, wherein the laser light source is a semiconductor laser device having a Fabry-Perot optical resonator cavity.

6. The non-polarized light source according to claim 4, further comprising a reflector provided between the laser light source and the polarization dispersion device, wherein the reflector selectively reflects a portion of the light beam output from the laser light source and forms an external resonator.

7. A Raman amplifier comprising:

an optical fiber that is a Raman-amplifying medium and that carries a light signal;

the non-polarized light source according to claim 1; and an injection unit that injects into the optical fiber the pump light.

8. A Raman amplifier comprising:

an optical fiber that is a Raman-amplifying medium and that carries a light signal;

the non-polarized light source according to claim 4; and an injection unit that injects into the optical fiber the pump light.

9. A non-polarized light source, comprising:

a laser light source that transmits a substantially linearly-polarized light beam, the substantially linearly-polarized light beam having plural mode components arranged at an interval $\Delta\omega$ of substantially equal angular frequency; and a polarization dispersion device optically coupled to the laser light source such that a polarization axis of the polarization dispersion device is at substantially a 45° angle with respect to a polarization axis of the light being output from the laser light source, wherein the polarization dispersion device performs a polarization mode dispersion such that a substantially non-polarized output is obtained even when an optical path difference between the two polarization modes of the linearly-polarized light beam is less than the coherent length of the laser light source.

10. The non-polarized light source according to claim 1, wherein the laser light source includes a semiconductor laser and a reflector which selectively reflects a portion of the light beam output from the semiconductor laser.

11. The non-polarized light source according to claim 1, wherein the polarization dispersion device is a polarization maintaining fiber.

12. The non-polarized light source according to claim 4, wherein the laser light source includes, a first laser light source that outputs a first light beam, a second laser light source that outputs a second light beam, and a polarization combining unit that polarization combines the first light beam and the second light beam.

* * * * *